US008146036B1

(12) United States Patent
Ren (10) Patent No.: US 8,146,036 B1
(45) Date of Patent: Mar. 27, 2012

(54) CIRCUIT FOR AND METHOD OF DETERMINING A PROCESS CORNER FOR A CMOS DEVICE

(75) Inventor: Guo Jun Ren, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 607 days.

(21) Appl. No.: 12/361,722

(22) Filed: Jan. 29, 2009

(51) Int. Cl.
  *G06F 17/50* (2006.01)
(52) U.S. Cl. ...................................................... 716/110
(58) Field of Classification Search .................. 716/100, 716/110
  See application file for complete search history.

(56) References Cited

U.S. PATENT DOCUMENTS

| 7,672,152 B1 * | 3/2010 | Kulkarni et al. ............... 365/154 |
| 2004/0051562 A1 * | 3/2004 | Gauthier et al. ................ 326/98 |
| 2007/0018864 A1 * | 1/2007 | Khan et al. ..................... 341/118 |
| 2008/0195359 A1 * | 8/2008 | Barker et al. ...................... 703/2 |
| 2009/0295426 A1 * | 12/2009 | Ayyapureddi et al. .......... 326/30 |
| 2010/0283051 A1 * | 11/2010 | Mayor ............................. 257/48 |

* cited by examiner

*Primary Examiner* — Suchin Parihar
(74) *Attorney, Agent, or Firm* — John J. King (57) ABSTRACT

A circuit for determining a process corner for a CMOS device of an integrated circuit is disclosed. The circuit comprises a CMOS monitoring circuit comprising an NMOS transistor and a PMOS transistor of the integrated circuit; reference circuit comprising elements for generating a reference voltage for an NMOS transistor and a reference voltage for a PMOS transistor; a first comparator for comparing a voltage generated by the NMOS transistor monitored by the CMOS monitoring circuit with the reference voltage for a NMOS transistor; and a second comparator for comparing a voltage generated by the PMOS transistor monitored by the CMOS monitoring circuit with the reference voltage for a PMOS transistor. A method for determining a process corner for CMOS devices of an integrated circuit is also disclosed.

20 Claims, 7 Drawing Sheets

CIRCUIT FOR AND METHOD OF DETERMINING A PROCESS CORNER FOR A CMOS DEVICE

FIELD OF THE INVENTION

The present invention relates generally to integrated circuit devices, and in particular, to a circuit for and a method of determining a process corner for a CMOS device.

BACKGROUND OF THE INVENTION

Transistors of integrated circuit devices have uncertainty in a number of parameters. For example, process variations may lead to transistors formed in a die of a silicon wafer or across the wafer to have different effect lengths ($L_{eff}$) of the gate region, different threshold voltages ($V_T$) for turning on the transistor, or different thicknesses of the gate oxide ($t_{OX}$). For example, a device may be fast if it has a short effective length, a low threshold voltage, or a thin gate oxide. Conversely, a device may be slow if it has a long effective length, a high threshold voltage, or a thick gate oxide. In modern complementary metal oxide semiconductor (CMOS) process, a CMOS pair comprising n-type metal oxide semiconductor (NMOS) transistor and a p-type metal oxide semiconductor (PMOS) may have different "strengths." The combination of these or other parameters may affect the characteristics of each of the devices of the CMOS pair. Because some parameters are independent for NMOS and PMOS devices, one device of the CMOS pair may have one characteristic, while the other device may have another characteristic.

Figure 1:
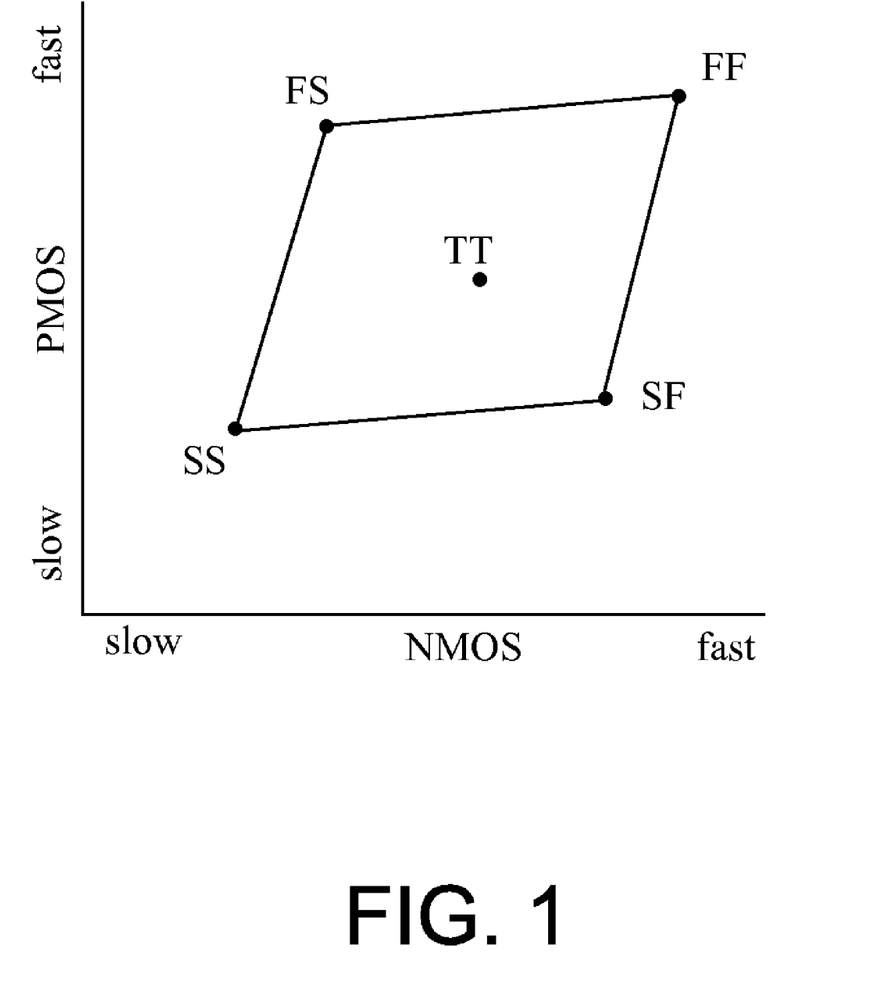
FIG. 1 is a graph showing process corners for a CMOS device.

The process corners for CMOS devices show a characteristic of the transistor, such as slow to fast, with an NMOS transistor plotted on one axis and a PMOS transistor plotted the other axis as shown for example in FIG. 1. The four corners are defined by a slow-slow (SS) corner, where both the PMOS transistor and the NMOS transistors are slow, a fast-fast (FF) corner, where both the PMOS transistor and the NMOS transistors are fast, a slow-fast (SF) corner, where the PMOS transistor is slow and the NMOS transistors is fast, and a fast-slow (FS) corner, where the PMOS transistor is fast and the NMOS transistors is slow. A CMOS pair having typical PMOS and NMOS transistors is designated as a TT CMOS pair which is located somewhere in the middle of the four corners on the grid. Digital and analog circuit designers are facing more and more challenges to optimize their circuits and meet performance goal across all process corners.

SUMMARY OF THE INVENTION

A circuit for determining a process corner for a CMOS device of an integrated circuit is disclosed. The circuit comprises a CMOS monitoring circuit comprising an NMOS transistor and a PMOS transistor of the integrated circuit; reference circuit comprising elements for generating a reference voltage for an NMOS transistor and a reference voltage for a PMOS transistor; a first comparator coupled to the CMOS monitoring circuit and the reference circuit, the first comparator comparing a voltage generated by the NMOS transistor monitored by the CMOS monitoring circuit with the reference voltage for a NMOS transistor; and a second comparator coupled to the CMOS monitoring circuit and the reference circuit, the second comparator comparing a voltage generated by the PMOS transistor monitored by the CMOS monitoring circuit with the reference voltage for a PMOS transistor. The CMOS monitoring circuit may comprise a resistor in series with the NMOS transistor and the PMOS transistor, wherein the resistor in series with the NMOS transistor and the PMOS transistor comprises a resistor external to the integrated circuit device. The reference circuit may comprise elements for generating a reference voltage for an NMOS transistor and a reference voltage for a PMOS transistor comprises a series of resistors.

According to an alternate embodiment, a circuit for determining a process corner for a CMOS device of an integrated circuit comprises a CMOS monitoring circuit comprising an NMOS transistor and a PMOS transistor of the integrated circuit coupled in series, wherein an NMOS monitor voltage is generated at a node of the NMOS transistor and a PMOS monitor voltage is generated at a node of the PMOS transistor; a reference circuit comprising a series of resistors for generating a reference voltage for an NMOS transistor and a reference voltage for a PMOS transistor; a first comparator coupled to the CMOS monitoring circuit and the reference circuit, the first comparator comparing the NMOS monitor voltage generated at the node of the NMOS transistor and the reference voltage for the NMOS transistor; and a second comparator coupled to the CMOS monitoring circuit and the reference circuit, the second comparator comparing the PMOS monitor voltage generated at the node of the PMOS transistor and the reference voltage for the PMOS transistor. The circuit may further comprise a first series of switches for selection an output of the CMOS monitoring circuit or an output of the reference circuit to an analog-to-digital circuit and a second series of switches for coupling the output of the analog-to-digital circuit to a comparator circuit.

A method of determining a process corner for a CMOS device of an integrated circuit is also disclosed. The method comprises monitoring an output of an NMOS transistor and an output of a PMOS transistor of a CMOS device of the integrated circuit; generating a reference voltage for NMOS transistors and a reference voltage for PMOS transistors of the integrated circuit; comparing a voltage generated by the NMOS transistor to the reference voltage for NMOS transistors of the integrated circuit; comparing a voltage generated by the PMOS transistor to the reference voltage for PMOS transistors of the integrated circuit; and generating a process corner estimation for the CMOS device. Generating a reference voltage for NMOS transistors and a reference voltage for PMOS transistors of the integrated circuit may comprise generating a reference voltage for NMOS transistors and a reference voltage for PMOS transistors of the integrated circuit based upon a resister external to integrated circuit.

DETAILED DESCRIPTION

Figure 2:
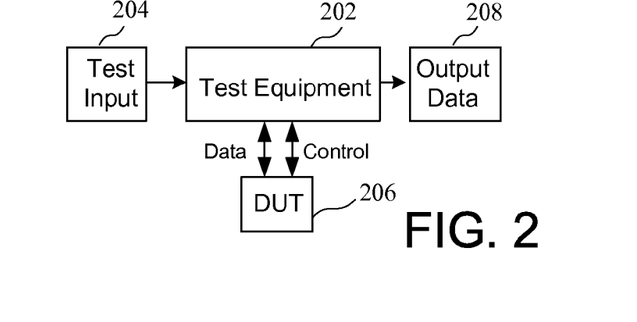
FIG. 2 is a block diagram of a system for testing integrated circuit dies according to an embodiment of the present invention.

Turning now to FIG. 2 is a block diagram of a system for testing integrated circuit dies according to an embodiment of the present invention. Test equipment 202 receives a test input 204 comprising test data and/or configuration data for a device under test 206 and generates output data 208. The test equipment 202 couples data and control signal to and receives return data and control signals from the device under test 206. A test output from the device under test will be provided to the test equipment using the test equipment clock. The test output will generally provide information verifying circuit elements in the device under test. As will be described in more detail below, the embodiments of the present invention provides process information related to an integrated circuit, such as a programmable logic device.

Figure 3:
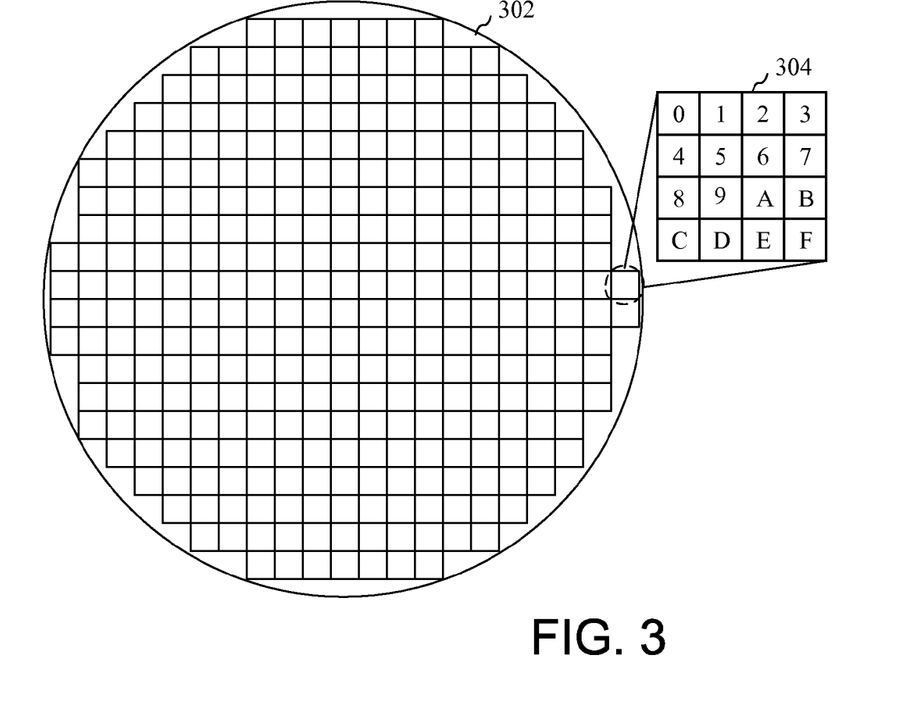
FIG. 3 is a wafer having a plurality of integrated circuit dies according to an embodiment of the present invention.

Turning now to FIG. 3, a wafer having a plurality of integrated circuit dies according to an embodiment of the present invention is shown. FIG. 3 shows a silicon wafer 302 having dies for programmable logic devices represented by the squares. A representative die 304 may be divided into different regions, where 16 regions are shown here. As will be described in more detail below, each of the 16 regions may include a circuit for determining a process corner for CMOS devices in the region. The regions need not be the same size or evenly distributed on the die. While die 304 is shown divided into sixteen regions, the die may be defined by more or fewer regions.

Figure 4:
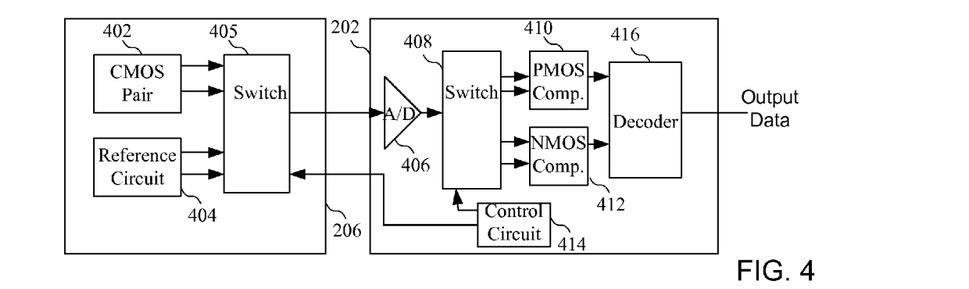
FIG. 4 is a block diagram of circuit for determining a process corner for CMOS devices according to an embodiment of the present invention.

Turning now to FIG. 4, a block diagram of circuit for determining a process corner for CMOS devices according to an embodiment of the present invention is shown. As shown in the embodiment of FIG. 4, the integrated circuit comprises a CMOS pair 402 and a reference circuit 404 coupled to a switch 405. As will be described in more detail below, the switch 405 is optional, and it used to minimize the amount of circuitry required to determine the process corners of the CMOS pair. The output of the switch is coupled to an A/D converter 406 of the test equipment 202. The A/D converter converts an analog voltage to a digital value. A second switch 408 at the output of the A/D converter enables signals generated by the CMOS pair and the reference circuit of the device under test 206 to be coupled to a comparator. In particular, the switch 408 enables coupling signals from the CMOS pair 402 or the reference circuit 404 to a PMOS comparator 410 or an NMOS comparator 412. A control circuit 414 controls the switches 405 and 408 to enable selectively coupling a signal from either the CMOS pair 402 or the reference circuit 404 to the PMOS comparator 410 or the NMOS comparator 412 so that the appropriate signal is coupled to the appropriate comparator. The outputs of the comparators are coupled to a decoder 416 for generating a process corner for the die. Although a single CMOS pair is shown, multiple CMOS pairs may be positioned at different locations of the die. By determining the process corners, circuit designers are able to make better decisions in supply voltage choice, quiescent power consumption, the use of pass transistors and temperature of operation.

Figure 5:
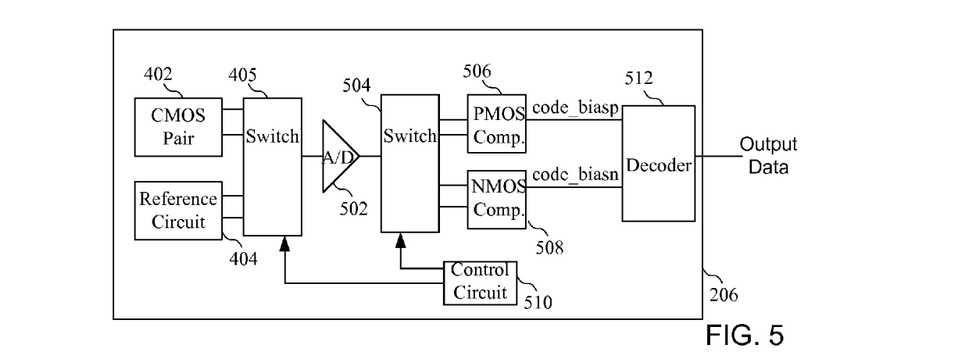
FIG. 5 is a block diagram of circuit for determining a process corner for CMOS devices according to an alternate embodiment of the present invention.

Turning now to FIG. 5, a block diagram of circuit for determining a process corner for CMOS devices according to an alternate embodiment of the present invention is shown. As shown in the embodiment of FIG. 5, the integrated circuit comprises the CMOS pair 402 and the reference circuit 404 coupled to the switch 405, wherein the output of the switch is coupled to an A/D converter 502 of the device under test. A second switch 504 at the output of the A/D converter enables signals generated by the CMOS pair and the reference circuit of the device under test 206 to be coupled to the A/D converter 502. Accordingly, the switch 504 enables coupling signals from the CMOS pair 402 or the reference circuit 404 to a PMOS comparator 506 or an NMOS comparator 508 of the device under test. In particular, a control circuit 510 controls the switches 405 and 504 to enable selectively coupling a signal from either the CMOS pair 402 or the reference circuit 404 to the PMOS comparator 506 or the NMOS comparator 508. The control circuit 510 on the device under test provides the same functionality as the control circuit 414 of FIG. 4 to control the switching networks 405 and 504 to couple the appropriate signal to the appropriate comparator. The outputs of the comparators are coupled to a decoder 512 for generating a process corner for the die. The switches in the device of FIG. 5 are particularly beneficial when the circuit or circuits for determining a process corner is implemented in an integrated circuit device. By using the switching networks, only a single A/D converter is used, thereby reducing the circuit requirements for the device under test.

Figure 6:
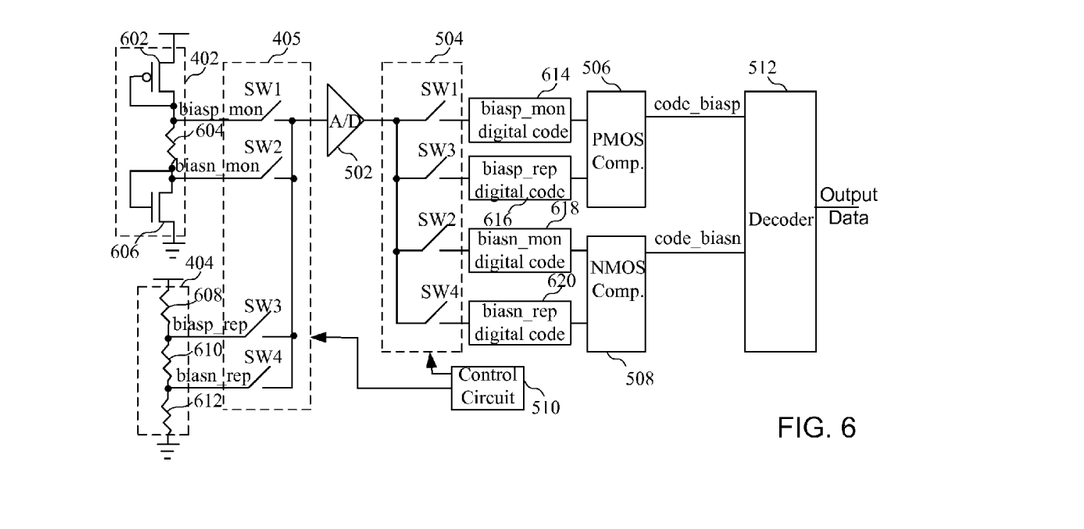
FIG. 6 is block diagram of portions of the circuits of FIGS. 4 and 5 according to an alternate embodiment of the present invention.

Turning now to FIG. 6, a block diagram portions of the circuits of FIGS. 3 and 4 according to an alternate embodiment of the present invention is shown. The circuit of FIG. 6 is shown by way of example in reference to FIG. 5. In particular, the CMOS pair, the switching networks and digital code generators are shown in more detail. The CMOS pair comprises a PMOS transistor 602 having a gate coupled to a drain and a first terminal of a resistor 604, where the second terminal of the resistor is coupled to the drain and the gate of the NMOS transistor. The source of the PMOS transistor is coupled to a power supply and the source of the NMOS transistor is coupled to ground. As will be described in more detail below, the PMOS transistor 602 and the NMOS transistor 606 are configured as resistors, and therefore voltages generated at nodes of the CMOS pair 402 may be evaluated against voltages generated by known resistances of the reference circuit 404. The voltage at the drain of the PMOS transistor is a monitor voltage designated as a biasp_mon voltage, while the voltage at the drain of the NMOS transistor is a monitor voltage designated as the biasn_mon voltage. As will be described in more detail below, these voltages will be compared to reference voltages to determine a characteristic of the transistors of the PMOS pair, such as whether the transistor is fast or slow. The resistor 604 may be external to the device under test so that a highly accurate resistor may be used. By providing a highly accurate resistor, the voltage drops across the PMOS and NMOS transistors may be determined more accurately.

The reference circuit comprises a series of resistors having a first resistor 608 coupled to the power supply and the reference resistor 610. The second terminal of the second resistor comprising a reference resistor is coupled to a third resistor 612. The voltage at the node between the first resistor and the second resistor comprises a biasp_rep voltage, while the voltage at the node between the second and third resistors comprises a biasn_rep voltage. Because voltages at nodes between the resistances are measured, all of the resistors may be on the device under test. That is, because all of the resistors should have approximately the same characteristics, the voltages at the nodes should provide accurate reference values because the series resistors provide values based upon a ratio measurement.

The switching network 405 comprises a plurality of switches enabling selecting a particular node to determine the voltage drop at that node. By selecting SW1 of the switching network 405, it is possible to determine the voltage drop across the PMOS transistor 602. By selecting SW2, it is possible to determine the voltage drop across the NMOS transistor 606. By selecting SW3, it is possible to determine the voltage drop across the resistor 608, while selecting SW4, it is possible to determine the voltage drop across the resistor 612. Depending upon which value is being read, a corresponding switch in the switching network 504 is also selected. Accordingly, the four values coupled to the comparators may be generated by selectively switching through SW1-SW4.

Digital code generators 614-620 generate a digital code based upon the voltages coupled to them. For the biasn_mon and biasn_rep voltages, the digital code is based upon the detected voltages because those voltages are taken with reference to ground. For the biasp_mon and biasp_rep voltages, those voltages are subtracted from the reference voltage to get the voltage drop across the transistor or resistor. The PMOS comparator compares the digital code representing the voltage drop across the PMOS transistor and the digital code representing the voltage drop across the resistor 608 to determine a characteristic of the PMOS transistor, such as whether the PMOS transistor is fast or slow. Similarly, the NMOS comparator compares the digital code representing the voltage drop across the NMOS transistor and the digital code representing the voltage drop across the resistor 612 to determine a characteristic of the NMOS transistor, such as whether the NMOS transistor is fast or slow. The decoder 512 generates output data comprising one of the process corners or determination that a transistor pair is typical based upon the outputs of the comparators.

Figure 7:
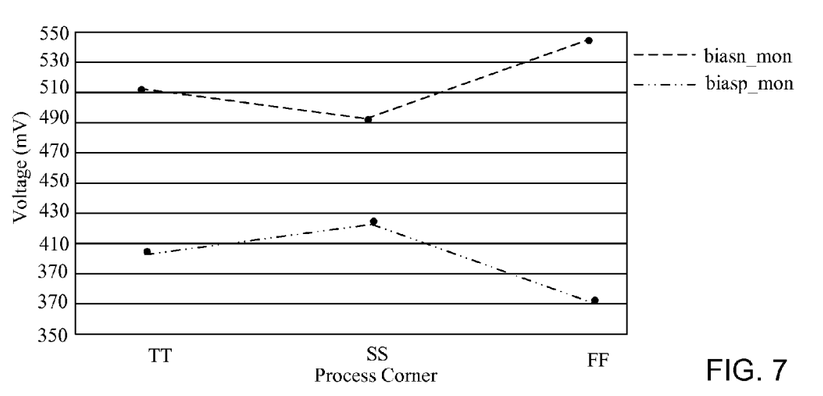
FIG. 7 is a graph showing the process corners for biasp_mon and biasn_mon signals for SS and FF process corners according to the present invention.
Figure 8:
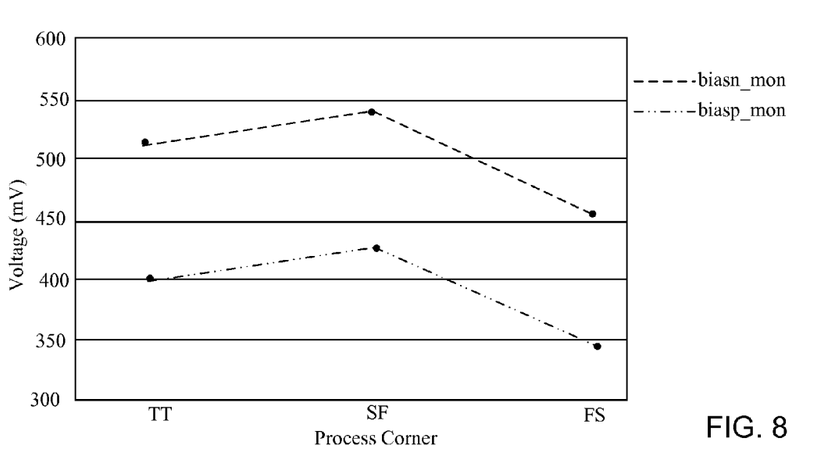
FIG. 8 is a graph showing the process corners for biasp_mon and biasn_mon signals for FS and SF process corners according to the present invention.
Figure 9:
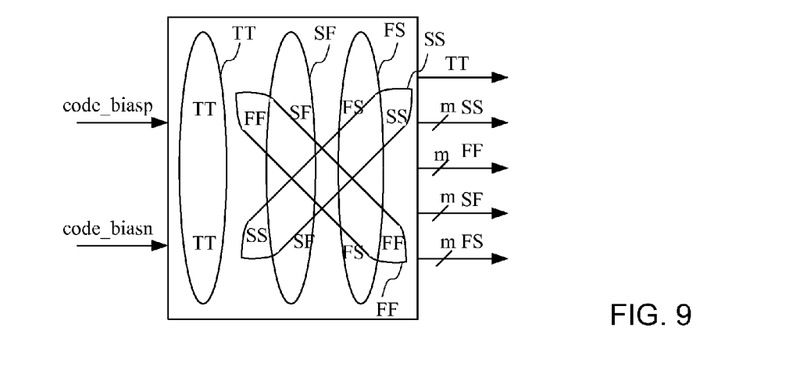
FIG. 9 is diagram showing the outputs of the decoder according to an embodiment of the present invention.

As shown in FIGS. 7 and 8, the biasp_mon and biasn_mon are plotted as a function of the reference voltages. In FIG. 7, the biasp_mon and biasn_mon are plotted for the TT, SS and FF process corners, while the biasp_mon and biasn_mon are plotted for the TT, SF and FS process corners. The actual value of the biasp_mon and biasn_mon are used to determine the code_biasp and code_biasn. For a given reference value indicated by the value of TT, a CMOS device will be considered to be an SS process corner if the biasn_mon value is greater than the reference voltage for the TT device and the biasp_mon is less than the reference voltage for the TT device. As shown in FIG. 9, these values are then used to determine how to best characterize the CMOS device. For example, a CMOS device is considered to be a TT device if the code_biasp and/or the code_biasn values are equal to "0". A CMOS device is considered to be a SS device if the code_biasp value is less than "0" and code_biasn value is greater than "0". A CMOS device is considered to be a FF device if the code_biasp value is greater than "0" and code_biasn value is less than "0". A CMOS device is considered to be a SF device if the code_biasp value is greater than "0" and code_biasn value is greater than "0". A CMOS device is considered to be a FS device if the code_biasp value is less than "0" and code_biasn value is less than "0". According to one aspect of the invention, the decoder may output specific process "sigma" corner information. The "m" is the bus width and output an SS[1:0] indicating the sigma value representing a variation from the process corner. For example, SS[1:0] is equal to "01" for a 1 sigma variation in the process corner, SS[1:0] is equal to "10" for a 2 sigma variation in the process corner and SS[1:0]="11" for a 3 sigma variation in the process corner.

Figure 10:
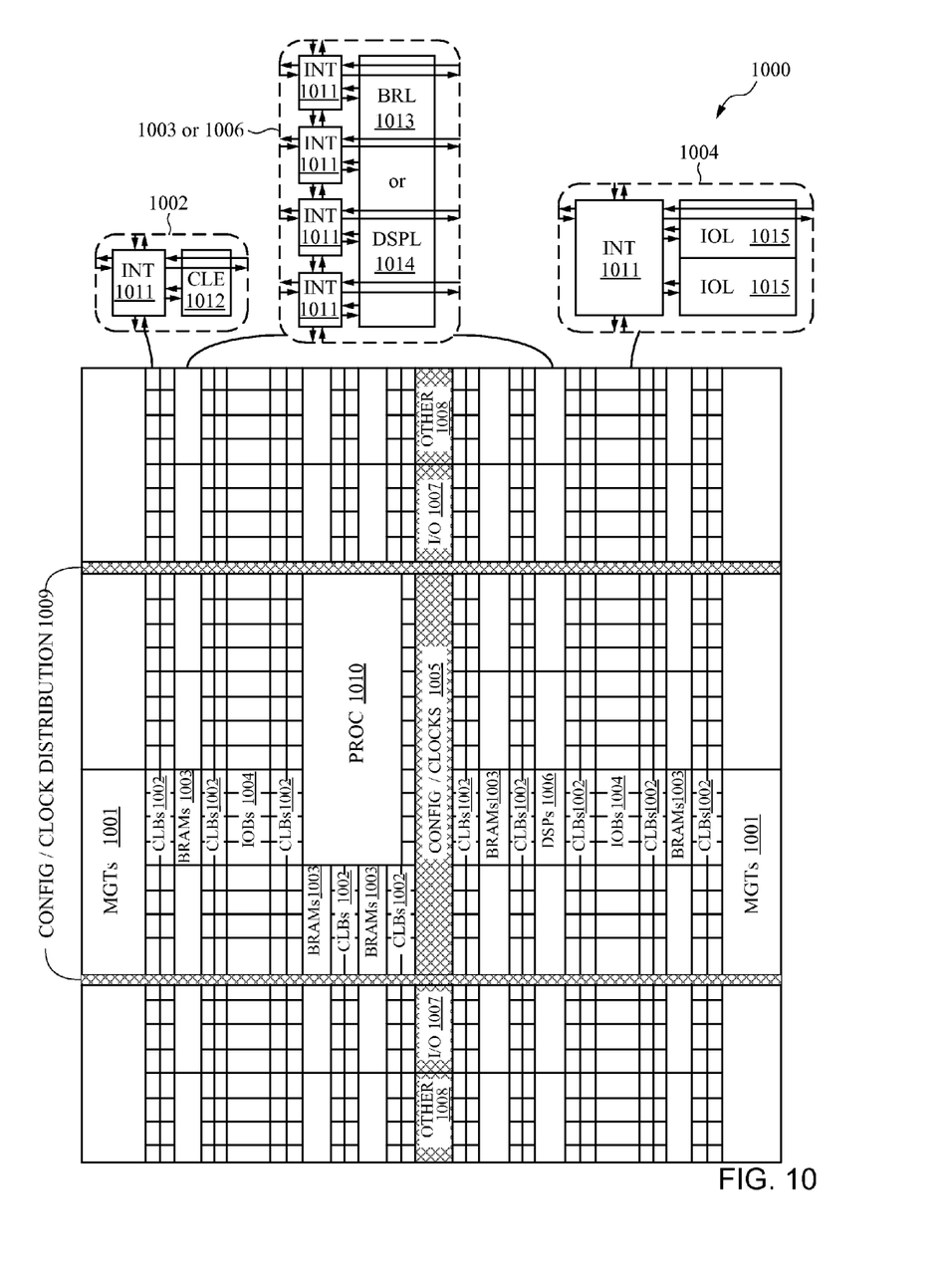
FIG. 10 is a block diagram of a device having programmable logic according to an embodiment the present invention.

Turning now to FIG. 10, a block diagram of a device having configurable logic according to an embodiment the present invention is shown. While devices having programmable logic may be implemented in any type of integrated circuit device, such as an application specific circuit having programmable logic, other devices comprises dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 10 comprises an FPGA architecture 1000 having a large number of different programmable tiles including multi-gigabit transceivers (MGTs 1001), configurable logic blocks (CLBs 1002), random access memory blocks (BRAMs 1003), input/output blocks (IOBs 1004), configuration and clocking logic (CONFIG/CLOCKS 1005), digital signal processing blocks (DSPs 1006), specialized input/output blocks (I/O 1007) (e.g., configuration ports and clock ports), and other programmable logic 1008 such as digital clock managers, analog-to-digital converters, system monitoring logic, and so forth. Some FPGAs also include dedicated processor blocks (PROC 1010).

In some FPGAs, each programmable tile includes a programmable interconnect element (INT 1011) having standardized connections to and from a corresponding interconnect element in each adjacent tile. Therefore, the programmable interconnect elements taken together implement the programmable interconnect structure for the illustrated FPGA. The programmable interconnect element (INT 1011) also includes the connections to and from the programmable logic element within the same tile, as shown by the examples included at the top of FIG. 10.

For example, a CLB 1002 may include a configurable logic element (CLE 1012) that may be programmed to implement user logic plus a single programmable interconnect element (INT 1011). A BRAM 1003 may include a BRAM logic element (BRL 1013) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 1006 may include a DSP logic element (DSPL 1014) in addition to an appropriate number of programmable interconnect elements. An IOB 1004 may include, for example, two instances of an input/output logic element (IOL 1015) in addition to one instance of the programmable interconnect element (INT 1011). The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 10) is used for configuration, clock, and other control logic. Horizontal areas 1009 extending from this column are used to distribute the clocks and configuration signals across the breadth of the FPGA. Some FPGAs utilizing the architecture illustrated in FIG. 10 include additional logic blocks that disrupt the regular columnar structure making up a large part of the FPGA. The additional logic blocks may be programmable blocks and/or dedicated logic. For example, the processor block PROC 1010 shown in FIG. 10 spans several columns of CLBs and BRAMs.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear, to facilitate the efficient implementation of user logic. The circuits and methods of the present invention may be implemented in the PLD of FIG. 10, or in any other suitable device, including any type of integrated circuit having programmable logic. The comparators and decoders may be implemented in configurable logic blocks which may be coupled to the CMOS pair and reference circuit by programmable interconnect circuits, while the control circuit may be implemented in the processor.

Figure 11:
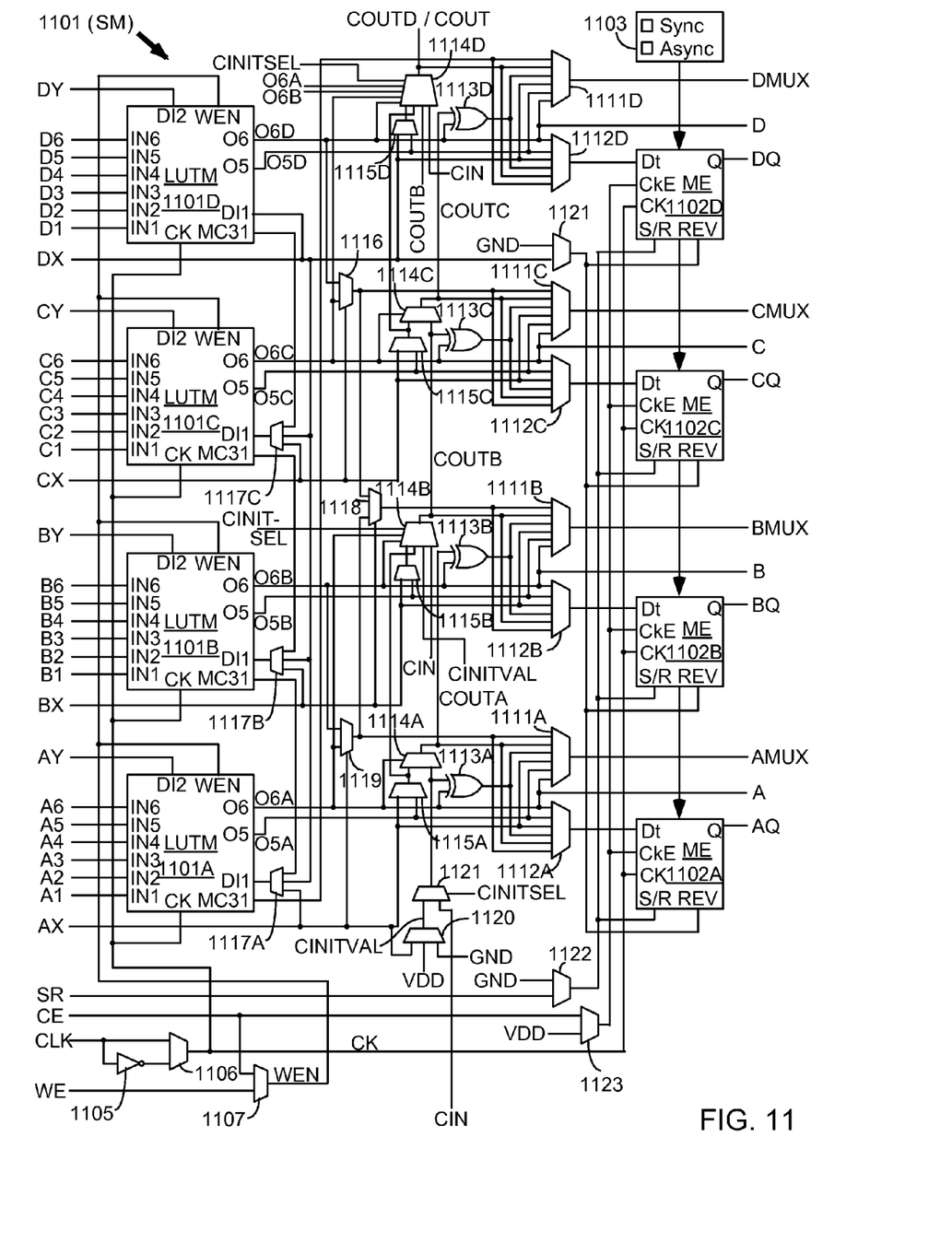
FIG. 11 is a configurable logic element of the device of FIG. 10 according to an embodiment of the present invention.

Turning now to FIG. 11, a block diagram of a configurable logic element of the device of FIG. 10 according to an embodiment of the present invention is shown. In particular, FIG. 11 illustrates in simplified form a configurable logic element of a configuration logic block 1002 of FIG. 10. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by input terminals DI_1 and DI_2 to the data input (DI) terminal of the associated function generator. Each function generator, which may comprise a lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 1102 coupled to a multiplexer 904. In particular, the LUT 1102 receives 4 input signals which are decoded to generate an output D1 associated with data stored in the LUT at the address designated by the input signals. The multiplexer 1104 is adapted to receive the output of LUT 1102 and a registered value of Reg_DI_1. The output of the multiplexer 1104 is coupled to a register 1106 which generates an output Q1.

A Write Control Circuit 1108 is coupled to receive RAM control signals and generate signals to control the LUT 1102. In addition to a data input (DI) coupled to receive DI_1 and conventional read and write control signals coupled to a read enable input (R) and a write enable input (W), respectively, the LUT 1102 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 1110 coupled to a multiplexer 1112. The LUT 1110 is adapted to receive input signals IN4-IN7, while the multiplexer 1112 is coupled to receive the output D2 of the LUT 1110 and the registered input value Reg_DI_2. The output of the multiplexer 1112 is coupled to a register 1114 which generates an output Q2. The write control circuit 1108 also generates a partial reset signal and an initial state signal for selectively resetting or setting one or more of the bits of the LUT 1110.

Similarly, slice 2 comprises a function generator implemented as a LUT 1122 coupled to a multiplexer 1124. The LUT 1122 is adapted to receive input signals IN8-1N11, while the multiplexer 1124 is coupled to receive the output of the LUT 1122 and a registered input value Reg_DI_3. The output of the multiplexer 1124 is coupled to a register 1126 which generates an output Q3. A Write Control Circuit 1128 is coupled to receive RAM control signals and generate signals to control the LUT 1122. In particular, input signals IN8-IN11 are decoded to generate an output D3 associated with data stored in the LUT at the address designated by the input signals. The LUT 1122 comprises a partial reset input (RST) for receiving a partial reset signal, and an initial state input (IS) for receiving an initial state signal. Similarly, slice 2 comprises a function generator implemented as a LUT 1130 coupled to a multiplexer 1132. The LUT 1130 is adapted to receive input signals IN12-IN15, while the multiplexer 1132 is coupled to receive the output D4 of the LUT 1130 and a registered input value Reg_DI_4. The output of the multiplexer 1132 is coupled to a register 1134 which generates an output Q4. The write control circuit 1128 also generates a partial reset signal and an initial state signal for selectively resetting or setting one or more of the bits of the LUT 1130. According to one embodiment, the circuit for determining a process corner for a CMOS device may be programmed into the device during testing, wherein the elements used to implement the circuit for determining a process corner may be used as needed when the device is used in the field. That is, because circuits of a programmable logic device may be reprogrammed, the circuit or circuits for determining a process corner may be temporarily implemented in the integrated circuit for purposes of determining the characteristics of a particular die, and then removed to provide those resources for other circuits.

Figure 12:
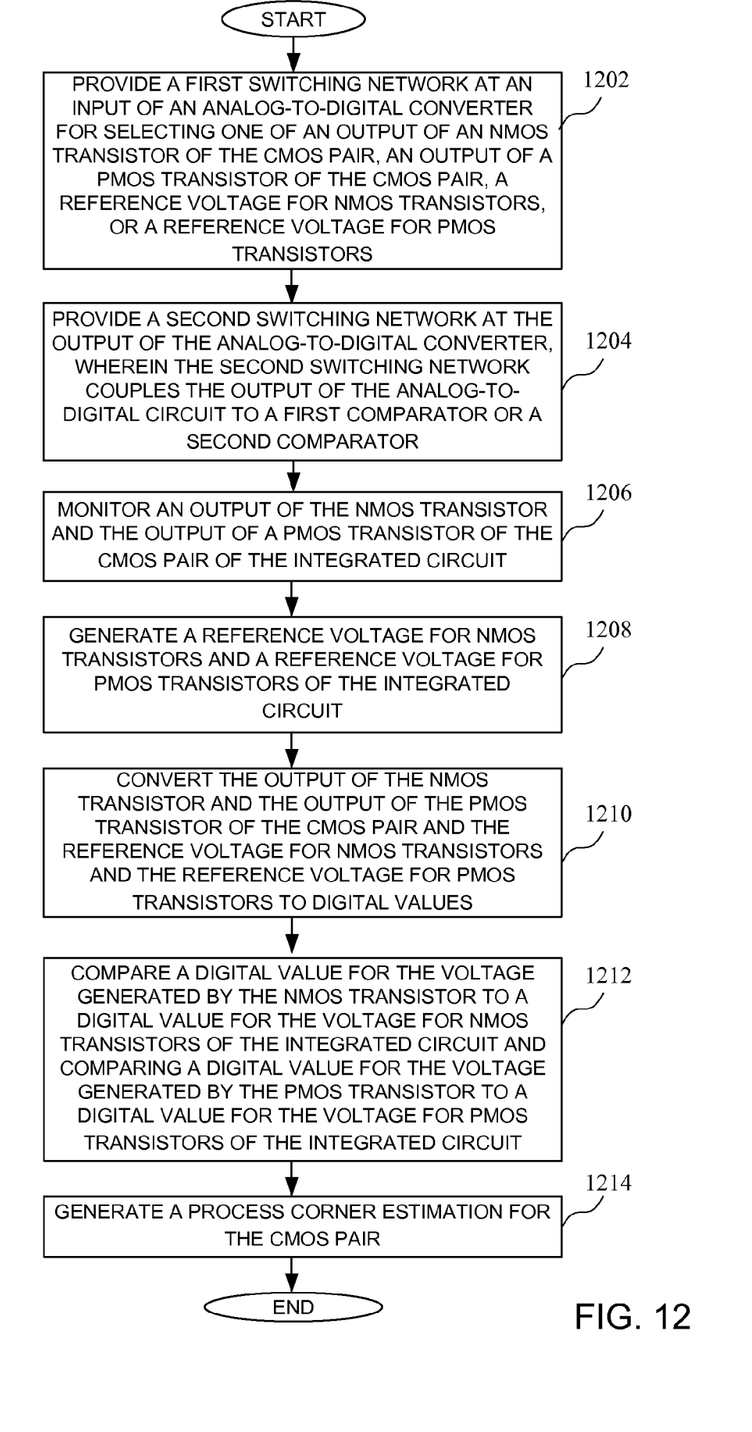
FIG. 12 is a flow chart showing an example of a method of determining a process corner for a CMOS device according to an embodiment of the present invention.

Turning now to FIG. 12, a flow chart shows a method of determining a process corner for a CMOS device according to an embodiment of the present invention. In particular, a first switching network is provided at an input of an analog-to-digital converter for selecting one of an output of an NMOS transistor of the CMOS pair, an output of a PMOS transistor of the CMOS pair, a reference voltage for NMOS transistors, or a reference voltage for PMOS transistors at a step 1202. A second switching network is provided at the output of the analog-to-digital converter, wherein the second switching network couples the output of the analog-to-digital circuit to a first comparator or a second comparator at a step 1204. An output of the NMOS transistor and the output of a PMOS transistor of the CMOS pair of the integrated circuit are monitored at a step 1206. A reference voltage for NMOS transistors and a reference voltage for PMOS transistors of the integrated circuit are generated at a step 1208. The output of the NMOS transistor and the output of the PMOS transistor of the CMOS pair and the reference voltage for NMOS transistors and the reference voltage for PMOS transistors are converted to digital values at a step 1210. A digital value for the voltage generated by the NMOS transistor and a reference digital value for the voltage for NMOS transistors of the integrated circuit are compared, and a digital value for the voltage generated by the PMOS transistor and a reference digital value for the voltage for PMOS transistors of the integrated circuit are compared at a step 1212. A process corner estimation for the CMOS pair is generated at a step 1214 based upon the comparison. The steps of the method of FIG. 12 may be implemented according to any of the embodiments as described above, or using any other suitable circuit.

It can therefore be appreciated that the new and novel circuit and method of determining a process corner for a CMOS device has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A circuit for determining a process corner characterizing a CMOS device of an integrated circuit, the circuit comprising:
   a CMOS monitoring circuit comprising an NMOS transistor and a PMOS transistor of the integrated circuit;
   a reference circuit comprising elements for generating a reference voltage for an NMOS transistor and a reference voltage for a PMOS transistor;
   a first comparator coupled to the CMOS monitoring circuit and the reference circuit, the first comparator comparing a voltage generated by the NMOS transistor monitored by the CMOS monitoring circuit with the reference voltage for an NMOS transistor; and
   a second comparator coupled to the CMOS monitoring circuit and the reference circuit, the second comparator comparing a voltage generated by the PMOS transistor monitored by the CMOS monitoring circuit with the reference voltage for a PMOS transistors;
   wherein the process corner characterizing the CMOS device comprises a value based upon an output of the first comparator and an output of the second comparator.

2. The circuit of claim 1 wherein the CMOS monitoring circuit comprises a resistor in series with the NMOS transistor and the PMOS transistor.

3. The circuit of claim 2 wherein the resistor in series with the NMOS transistor and the PMOS transistor comprises a resistor external to a die of the integrated circuit.

4. The circuit of claim 1 wherein the reference circuit comprising elements for generating a reference voltage for an NMOS transistor and a reference voltage for a PMOS transistor comprises a series of resistors.

5. The circuit of claim 1 wherein the first comparator and the second comparator comprise comparators which are implemented on the integrated circuit.

6. The circuit of claim 1 further comprising a second CMOS monitoring circuit comprising a second NMOS transistor and a second PMOS transistor of the integrated circuit.

7. The circuit of claim 1 further comprising an analog-to-digital converter coupled to receive an output of the CMOS monitoring circuit, the analog-to-digital converter providing a digital value to the first comparator or the second comparator.

8. A circuit for determining a process corner characterizing a CMOS device of an integrated circuit, the circuit comprising:
   a CMOS monitoring circuit comprising an NMOS transistor and a PMOS transistor of the integrated circuit coupled in series, wherein an NMOS monitor voltage is generated at a node of the NMOS transistor and a PMOS monitor voltage is generated at a node of the PMOS transistor;
   reference circuit comprising a series of resistors for generating a reference voltage for an NMOS transistor and a reference voltage for a PMOS transistor;
   a first comparator coupled to the CMOS monitoring circuit and the reference circuit, the first comparator comparing the NMOS monitor voltage generated at the node of the NMOS transistor and the reference voltage for the NMOS transistor; and
   a second comparator coupled to the CMOS monitoring circuit and the reference circuit, the second comparator comparing the PMOS monitor voltage generated at the node of the PMOS transistor and the reference voltage for the PMOS transistor;
   wherein the process corner characterizing the CMOS device comprises a value based upon an output of the first comparator and an output of the second comparator.

9. The circuit of claim 8 further comprising a first series of switches for coupling an output of the CMOS monitoring circuit or an output of the reference circuit to an analog-to-digital circuit.

10. The circuit of claim 9 further comprising a second series of switches for coupling the output of the analog-to-digital circuit to the first comparator or the second comparator.

11. The circuit of claim 10 further comprising a plurality of digital code generators at the output of the second series of switches, wherein each digital code generator of the plurality of digital code generators generates a digital code for an output of the CMOS monitoring circuit or the reference circuit.

12. The circuit of claim 8 wherein the first comparator outputs an NMOS comparison value and the second comparator outputs a PMOS comparison value.

13. The circuit of claim 12 further comprising a decoder coupled to receive the NMOS comparison value and the PMOS comparison value, wherein the decoder generates the value based upon the NMOS comparison value and the PMOS comparison value.

14. The circuit of claim 8 wherein a reference resistors of the reference circuit comprises a resistor external to die of the integrated circuit.

15. A method of determining a process corner characterizing a CMOS device of an integrated circuit, the method comprising:
- monitoring an output of an NMOS transistor and an output of a PMOS transistor of the CMOS device;
- generating a reference voltage for NMOS transistors and a reference voltage for PMOS transistors of the integrated circuit;
- comparing a voltage generated by the NMOS transistor to the reference voltage for NMOS transistors of the integrated circuit;
- comparing a voltage generated by the PMOS transistor to the reference voltage for PMOS transistors of the integrated circuit; and
- generating the process corner characterizing the CMOS device;
- wherein the process corner characterizing the CMOS device comprises a value based upon the comparison of the voltage generated by the NMOS transistor to the reference voltage for NMOS transistors and the comparison of the voltage generated by the PMOS transistor to the reference voltage for PMOS transistors.

16. The method of claim 15 wherein generating a reference voltage for NMOS transistors and a reference voltage for PMOS transistors of the integrated circuit comprises generating a reference voltage for NMOS transistors and a reference voltage for PMOS transistors of the integrated circuit based upon a resister external to integrated circuit.

17. The method of claim 15 further comprising converting the output of an NMOS transistor and the output of a PMOS transistor of the CMOS device and the reference voltage for NMOS transistors and the reference voltage for PMOS transistors to digital values, wherein generating the process corner characterizing the CMOS device comprises comparing a digital value for the voltage generated by the NMOS transistor to a digital value for the reference voltage for NMOS transistors of the integrated circuit and comparing a digital value for the reference voltage generated by the PMOS transistor to a digital value for the voltage for PMOS transistors of the integrated circuit.

18. The method of claim 15 further comprising selecting an output of a first switching network coupled to an input of an analog-to-digital converter, the output comprising one of the output of the NMOS transistor of the CMOS device, the output of the PMOS transistor of the CMOS device, the reference voltage for NMOS transistors, or the reference voltage for PMOS transistors.

19. The method of claim 18 further comprising selecting an output of a second switching network coupled to an output of the analog-to-digital converter, wherein the second switching network couples the output of the analog-to-digital circuit to a first comparator for comparing the output of the NMOS transistor and the reference voltage for the NMOS transistor or a second comparator for comparing the output of the PMOS transistor and the reference voltage for the PMOS transistor.

20. The method of claim 15 wherein generating process corner characterizing the CMOS device comprises generating a sigma value indicating a variation from the process corner.

* * * * *